(12) United States Patent
Lange et al.

(10) Patent No.: US 10,217,909 B2
(45) Date of Patent: Feb. 26, 2019

(54) OPTOELECTRONIC SEMICONDUCTOR COMPONENT

(71) Applicant: OSRAM Opto Semiconductors GmbH, Regensburg (DE)

(72) Inventors: Stefan Lange, Augsburg (DE); Vera Stöppelkamp, Augsburg (DE); Frank Jermann, Königsbrunn (DE); Andreas Biebersdorf, Regensburg (DE); Ralph Wirth, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 207 days.

(21) Appl. No.: 15/314,084

(22) PCT Filed: Jun. 10, 2015

(86) PCT No.: PCT/EP2015/062959
§ 371 (c)(1),
(2) Date: Nov. 27, 2016

(87) PCT Pub. No.: WO2015/189281
PCT Pub. Date: Dec. 17, 2015

(65) Prior Publication Data
US 2017/0200869 A1   Jul. 13, 2017

(30) Foreign Application Priority Data

Jun. 11, 2014 (DE) .......... 10 2014 108 188

(51) Int. Cl.
*H01L 33/04* (2010.01)
*H01L 33/50* (2010.01)
(Continued)

(52) U.S. Cl.
CPC .......... *H01L 33/504* (2013.01); *H01L 33/04* (2013.01); *H01L 33/505* (2013.01); *H01L 33/52* (2013.01);
(Continued)

(58) Field of Classification Search
CPC ....... H01L 33/04; H01L 33/505; H01L 33/52; H01L 33/62; H01L 33/10; H01L 33/405;
(Continued)

(56) References Cited

U.S. PATENT DOCUMENTS 5,851,063 A * 12/1998 Doughty ............. H01L 25/0753
362/231
7,151,283 B2   12/2006 Reeh et al.
(Continued)

FOREIGN PATENT DOCUMENTS

CN   1534802 A    10/2004
CN   102378801 A    3/2012
(Continued)

OTHER PUBLICATIONS

"Cree TW Series LED Bulb—External FAQs," CREE 2013, <http://creebulb.com/faqs#tab2>, 4 pages.
(Continued)

*Primary Examiner* — Kimberly N Rizkallah
*Assistant Examiner* — Dilinh P Nguyen
(74) *Attorney, Agent, or Firm* — Slater Matsil, LLP (57) ABSTRACT

An optoelectronic semiconductor component is disclosed. In an embodiment, the semiconductor component includes at least one optoelectronic semiconductor chip for generating primary radiation in a near-ultraviolet or in a visible spectral range, at least one phosphor for partial or complete conversion of the primary radiation into a longer-waved secondary radiation which is in the visible spectral range and at least one filter substance for partial absorption of the secondary
(Continued)

radiation, wherein the phosphor and the filter substance are closely connected to the semiconductor chip.

15 Claims, 5 Drawing Sheets

(51) Int. Cl.
*H01L 33/52* (2010.01)
*H01L 33/62* (2010.01)

(52) U.S. Cl.
CPC ............ *H01L 33/62* (2013.01); *H01L 33/502* (2013.01); *H01L 2224/48091* (2013.01); *H01L 2224/48247* (2013.01); *H01L 2224/48465* (2013.01)

(58) Field of Classification Search
CPC ......... H01L 33/42; H01L 33/44; H01L 33/50; H01L 33/58; H01L 33/36; H01L 33/48; H01L 33/0025; H01L 33/26
USPC ............................................ 257/98–100, 103
See application file for complete search history.

(56) References Cited

U.S. PATENT DOCUMENTS

| | | | |
|---|---|---|---|
| 7,462,086 B2 | 12/2008 | Mueller-Mach et al. | |
| 8,569,782 B2 | 10/2013 | Krauter | |
| 9,754,776 B2 | 9/2017 | Staats et al. | |
| 2005/0057145 A1* | 3/2005 | Shieh | C09K 11/7731 313/503 |
| 2011/0273079 A1* | 11/2011 | Pickard | H01L 33/504 313/483 |
| 2012/0300432 A1 | 11/2012 | Matsubayashi et al. | |
| 2013/0155647 A1* | 6/2013 | Tsukitani | H05B 33/0857 362/84 |
| 2015/0252963 A1* | 9/2015 | Stoll | H01L 33/504 362/293 |

FOREIGN PATENT DOCUMENTS

| | | |
|---|---|---|
| CN | 102460745 A | 5/2012 |
| DE | 102012211217 A1 | 1/2014 |
| EP | 2549330 A1 | 1/2013 |
| EP | 2595206 A1 | 5/2013 |
| WO | 9812757 A1 | 3/1998 |
| WO | 2010116294 A1 | 10/2010 |
| WO | 2013092079 A1 | 6/2013 |
| WO | 2014048682 A1 | 4/2014 |

OTHER PUBLICATIONS

"LH CP7P," OSRAM Opto Semiconductors, OSLON SSL 80, Datasheet, Version 1, Dec. 18, 2015, 29 pages.

* cited by examiner

OPTOELECTRONIC SEMICONDUCTOR COMPONENT

This patent application is a national phase filing under section 371 of PCT/EP2015/062959, filed Jun. 10, 2015, which claims the priority of German patent application 10 2014 108 188.9, filed Jun. 11, 2014, each of which is incorporated herein by reference in its entirety.

TECHNICAL FIELD

The invention relates to an optoelectronic semiconductor component.

SUMMARY OF THE INVENTION

Embodiments of the invention provide an optoelectronic semiconductor component that emits radiation having a high color rendering index and/or a high feeling of contrast index.

According to at least one embodiment, the optoelectronic semiconductor component comprises one or multiple optoelectronic semiconductor chips. The at least one optoelectronic semiconductor chip is adapted to generate primary radiation. Preferably, said primary radiation is in the near-ultraviolet and/or in the visible spectral range, e.g. in the blue spectral range. A peak wavelength of the primary radiation is particularly at least 340 nm or 420 nm or 440 nm and/or at most 500 nm or 485 nm or 470 nm. The optoelectronic semiconductor chip may be a light-emitting diode or a laser diode.

According to at least one embodiment, the semiconductor component comprises at least one phosphor or at least one phosphor mixture. The phosphor or the phosphor mixture is adapted for partial or complete conversion of primary radiation into a longer-waved secondary radiation. The secondary radiation is completely or partially in the visible spectral range. For example, the secondary radiation comprises an extension of the visible spectral range into the near-infrared spectral range. The terms phosphor mixture and phosphor will hereinafter be used synonymously for a better understanding.

According to at least one embodiment, the semiconductor component comprises one or more filter substances. The at least one filter substance is adapted for a partial absorption of the secondary radiation. Preferably, the filter substance does not or only insignificantly absorb in the range of the primary radiation. In other words, the filter substance is preferably permeable for primary radiation and not or not significantly absorbent.

According to at least one embodiment, the phosphor and the filter substance are closely connected to the semiconductor chip. This may mean that the semiconductor chip does not detach from the phosphor and the filter substance in proper use of the semiconductor component. Just as well, the phosphor and the filter substance may be attached to the semiconductor chip in a form-fit and direct manner. In particular, merely a connection means, by means of which the phosphor and/or the filter substance are attached to the semiconductor chip, is located between the semiconductor chip and the phosphor and/or the filter substance. Furthermore, there is no evacuated gap or a gap filled with gas between the semiconductor chip and the phosphor and/or the filter substance. In other words, preferably, there is a continuous material connection of solid materials between the semiconductor chip and the phosphor and/or the filter substance.

In at least one embodiment, the optoelectronic semiconductor component comprises at least one optoelectronic semiconductor chip for generating a primary radiation in the near-ultraviolet or visible spectral range. At least one phosphor for partial or complete conversion of primary radiation into a longer-waved secondary radiation, which is in the visible spectral range, is arranged downstream the semiconductor chip along a radiation direction. Furthermore, the optoelectronic semiconductor component comprises at least one filter substance for partial absorption of the secondary radiation. The phosphor and the filter substance are closely connected to the semiconductor chip here.

In addition to a high efficiency and a high service life, the characteristics of the emitted radiation is important as well, e.g. in optoelectronic semiconductor components based upon LEDs. In particular for the purpose of general lighting, a high color rendering index, CRI for short, is desired. Specifically in semiconductor components emitting warm-white light a color rendering index of at least 80 or at least 90 is to be achieved in several applications.

For the generation of warm-white light by means of light-emitting diodes, usually phosphors or phosphor mixtures are used that convert blue light of a light-emitting diode to a comparatively high proportion of long-waved light in the orange or orange-red spectral range. A typical spectrum of such a light source thus has an intensity maximum in comparatively great wavelengths. However, this reduces an overlap of the spectrum emitted by the semiconductor component and the eye sensitivity curve for light. Efficiency of the semiconductor component may be reduced due to said small overlap.

One option of increasing in particular the color rendering index later is arranging an external filter element downstream the semiconductor component. As a result, the color rendering index and/or the feeling of contrast index can be increased by selectively filtering certain spectral components. However, such an external filter arranged downstream the semiconductor component is visible to an observer when the semiconductor component is not in operation. This filter, which usually does not appear to be white, is undesirable in many applications.

In the semiconductor component described herein, both a high color rendering index and a high feeling of contrast index can be achieved while the external appearance of the semiconductor component is not negatively influenced by the filter substance in the switched-off state.

According to at least one embodiment, the phosphor and/or the filter substance are present as particles. A size of the particles is preferably at least 10 nm or 100 nm or 1 µm and/or at most 100 µm or 30 µm or 10 µm or 1 µm. The phosphor and the filter substance may have different particle sizes, in particular medium particle diameters.

According to at least embodiment, the particles of the phosphor and/or the particles of the filter substance are present in one or more matrix materials. The phosphor and the filter substance may thus be embedded in one single or in two different matrix materials. The matrix material preferably is a silicone or a silicone epoxy hybrid material. A phenyl silicone or a methyl silicone is used, for example.

According to at least one embodiment, the phosphor and the filter substance are mixed through. Preferably, the particles of the phosphor and the particles of the filter substance are randomly mixed-through, so that no or no significant phase separation is present between the phosphor and the filter substance. In other words, the filter substance and the phosphor are present in a homogenous mixture. As an alternative, it is possible that the phosphor and the filter substance are present in two separate layers or substantially segregated.

According to at least one embodiment, the filter substance is adapted to generate a tertiary radiation from the secondary radiation. In other words, the filter substance is a phosphor material just as well. Here, preferably, the tertiary radiation is in the near-infrared spectral range. Here, near-infrared particularly relates to wavelengths of at least 780 nm or 850 nm or 950 nm and/or of at most 1800 nm or 1500 nm or 1350 nm. Using such a filter substance allows minimizing the heat generated in the filter substance due to the absorption of the secondary radiation, since the energy can be transported away from the filter substance in an efficient manner via near-infrared radiation. In the case that the filter substance is embedded in a matrix material, said matrix material is preferably permeable to radiation for the non-visible tertiary radiation.

According to at least one embodiment, the phosphor and/or the filter substance, preferably present in the form of particles or even dissolved, are in a molded body, particularly in a common molded body. For example, the molded body is directly formed on and around the semiconductor chip and may touch the semiconductor chip. For example, the semiconductor chip is entirely enclosed by the molded body together with a carrier or a housing.

According to at least one embodiment, the phosphor and/or the filter substance, for example in the form of particles or dissolved, are accommodated in a plate. Said plate having the phosphor and the filter substance is directly or indirectly applied to the semiconductor chip. In the case of an indirect application, the plate is preferably bonded to the semiconductor chip. As an alternative, it is possible that the plate is generated directly on the semiconductor chip for example by means of a printing method or directly cured on the semiconductor chip or directly baked with the semiconductor chip. For example, the plate is a silicone plate to which the phosphor and the filter substance are added. As an alternative, the plate may be a glass plate or a ceramic plate in which the phosphor and/or the filter substance are embedded or in which the phosphor and/or the filter substance are sintered together.

According to at least one embodiment, the particles of the filter substance are designed as scattering particles. The filter substance preferably acts to be scattering the primary radiation and the secondary radiation then. An average diameter of the particles of the filter substance, e.g. $D_{50}$ measured in $D_0$ or in $D_2$ or in $D_3$, is at least 0.5 µm or 1.0 µm or 2.5 µm or 7.5 µm or 10 µm and/or at most 30 µm or 25 µm.

According to at least one embodiment, the semiconductor component is adapted to emit warm-white light. Warm-white light preferably relates to light having a correlated color temperature according to CIE of at least 2200 K or 2400 K or 2600 K and/or of at most 5000 K or 4000 K or 3500 K or 3100 K or 2900 K.

According to at least one embodiment, the color location of the radiation generated by the semiconductor component in the CIE standard color table is at the chromaticity coordinates x=0.46 and/or y=0.41, preferably with a tolerance of at most 0.03 units or 0.02 units or 0.01 units of the CIE standard color table each.

According to at least one embodiment, the radiation generated by the semiconductor component is white light. In particular, a color location of the radiation generated by the semiconductor component in the CIE standard color table has a maximum distance of 0.03 units or 0.02 units from the blackbody curve.

According to at least one embodiment, the color rendering index and/or the feeling of contrast index is increased through the filter substance compared to an identical semiconductor component without the filter substance. The color rendering index according to CIE is, for example, specified in detail in patent specification U.S. Pat. No. 5,851,063 A, see particularly columns 2 and 3. The disclosure of said patent specification regarding the color rendering index is incorporated herein by reference. The color rendering index of the radiation generated by the semiconductor component is preferably at least 80 or 85 or 90 or 93.

A definition of the feeling of contrast index, FCI for short, is specified in patent specification U.S. 2013/0155647 A1, for example, see particularly paragraphs 29 through 36. The disclosure of said patent specification regarding the feeling of contrast index is incorporated herein by reference. Preferably, the feeling of contrast index of the radiation emitted by the semiconductor component is at least 110 or 120 or 130.

According to at least one embodiment, the filter substance consists of semiconductor quantum dots or comprises such quantum dots. For example, such quantum dots are formed by semiconductor nanoparticles such as InP, CdSe, CdTe, CdS, CdSe, ZnS or ZnSe. An absorption behavior of such quantum dots can be adjusted by a diameter of the nanoparticles, with the diameter preferably being at least at 3 nm or 5 nm and/or 20 nm or 12 nm at most. As an alternative or in addition, the filter substance is formed by one or multiple organic filter substances or consists of organic filter substances.

According to at least one embodiment, the filter substance is an inorganic material. For example, the filter substance is a nitride, an oxide, an oxynitride, an aluminate, a glass or a garnet or comprises a material of one or more of said substance classes. The filter substance and the phosphor or one of the phosphors can be based upon the same material system and/or crystal system, the filter substance and the or one of the phosphors is a garnet, for example.

In particular, the filter substance is a material that is doped with one or more elements of the group of seldom earths or that comprises one or more elements of the group of seldom earths. Preferably, the filter substance comprises one or more of the following elements: Er, Ho, Nd, Tm, Pr, Sm.

According to at least one embodiment, the filter substance absorbs selectively and/or spectrally in a narrow-band type manner. In other words, the filter substance does not have a significant absorption across the entire spectral range of the secondary radiation. In particular, the filter substance absorbs spectrally in a narrow-band type manner in the wavelength range of at least 500 nm or 520 nm or 530 nm and/or 560 nm or 550 nm or 540 nm at most. The indicated wavelengths relate to a wavelength of maximum absorption. The term "spectrally in a narrow-band type manner" may mean that the respective absorption band of the filter substance has a full width at half maximum, FWHM for short, of 20 nm or 15 nm or 10 nm or 5 nm at most. Here, particularly wavelengths in which the filter substance in the semiconductor component presents absorption of at least 5% or 2% or 1% or 0.2% are referred to as absorbing.

According to at least one embodiment, the filter substance absorbs at least 0.5% or 1% or 2% of the entire secondary radiation. As an alternative or in addition, the proportion of the secondary radiation absorbed by the filter substance is 20% or 10% or 5% at the most.

According to at least one embodiment, the phosphor is a mixture of $(Lu, Ce)_3(Al, Ga)_5O_{12}$ and $(Ca, Sr, Ba)_2Si_5N_8$: Eu. As an alternative to said two phosphors, even organic and/or inorganic phosphors or phosphor mixtures can be used, in particular as indicated in patent document EP 2549330 A1. With respect to the phosphors, the disclosure of said patent document is incorporated herein by reference.

According to at least one embodiment, the filter substance is $Y_3Al_5O_{12}$:Nd. A proportion of the Y-lattice sites replaced with Nd preferably is at least 1% or 2% or 5% and/or 100% or 30% or 15% at most. In the case of a Nd content of 100%, this is $Nd_3Al_5O_{12}$ then.

According to at least one embodiment, a quotient of the weight of the phosphor and the weight of the filter material is at least 1 or 1.2 or 1.4. In other words, the weight of phosphor used exceeds the weight of the filter material used. As an alternative or in addition, said quotient is at most 5 or 3 or 2 or 1.5.

According to at least one embodiment, the phosphor and the filter substance are embedded in a common matrix material, preferably in the form of homogenously mixed particles, respectively. Here, the filter substance is preferably formed by $(Y_{1-x}, Nd_x)_3Al_5O_{12}$, for example with $0.04 \leq x$ or $0.06 \leq x$ or $0.08 \leq x$ or $0.1 \leq x$ and/or with $x \leq 0.6$ or $x \leq 0.45$ or $x \leq 0.3$ or $x \leq 0.2$ According to at least one embodiment, a weight proportion of a dopant of the filter substance such as Nd of a mixture of the phosphor, the filter substance and the matrix material is at least 1% or 1.5% or 4%. Alternatively or additionally, said weight proportion is at most 10% or 6.5% or 5%. Here, it may be true that the weight proportion of the filter substance, in particular of $(Y_{1-x}, Nd_x)_3Al_5O_{12}$ of the mixture of the matrix material, the phosphor and the filter substance is at least 20% or 40% and/or 80% or 60% at most.

According to at least one embodiment, the secondary radiation has an absolute intensity maximum at a peak wavelength of at least 570 nm or 590 nm or 605 nm. As an alternative or in addition, said intensity maximum is 650 nm or 630 nm or 620 nm at most.

BRIEF DESCRIPTION OF THE DRAWINGS

The optoelectronic semiconductor component described herein will hereinafter be described in greater detail with respect to the exemplary embodiment in conjunction with the drawing. Like reference numerals indicate like elements in the individual drawings. However, the size in the drawings is not to scale and individual elements may rather be shown in an exaggerated size for a better understanding.

The Figures show in.

DETAILED DESCRIPTION OF ILLUSTRATIVE EMBODIMENTS

Figure 1:
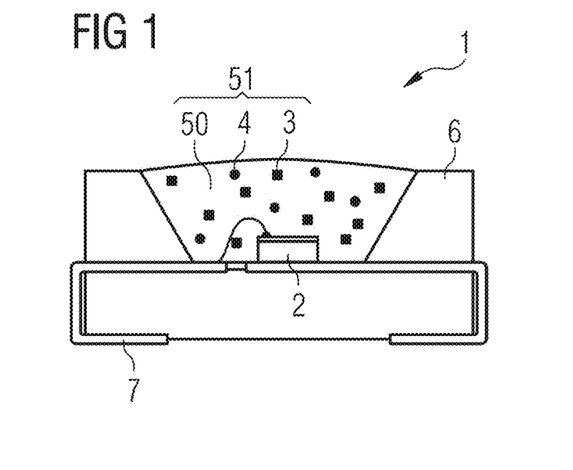
FIGS. 1 to 3 schematic sectional illustrations of exemplary embodiments of the optoelectronic semiconductor components described herein, FIG. 4 illustrations of emission spectra of semiconductor components, FIG. 5 illustrations of emission spectra of optoelectronic semiconductor components described herein, and FIG. 6 illustrations of the optical behavior of $Y_3Al_5O_{12}$: Nd depending on the Nd proportion.

FIG. 1 illustrates an exemplary embodiment of an optoelectronic semiconductor component 1. The semiconductor component 1 comprises an optoelectronic semiconductor chip 2, for example a light-emitting diode chip emitting blue light. The semiconductor chip 2 is located in a recess of a housing 6 and is thus electrically connected with electric contacts 7.

Along a main radiation direction, a molded body 51 follows the semiconductor chip 2. The molded body 51 is in direct contact with the semiconductor chip 2 and surrounds the semiconductor chip 2 in a form-fit manner. In other words, the molded body 51 is closely connected to the semiconductor chip 2.

The molded body 51 comprises a matrix material 50, which is a silicone, in particular a methyl silicone. Furthermore, particles of a phosphor 3 are introduced in the matrix material 50, wherein the phosphor represents a mixture of two different phosphor materials. Furthermore, particles of a filter substance 4 are located in the matrix material 50.

The phosphor 3 is composed of a first phosphor material and a second phosphor material. The first phosphor material is a phosphor with the composition of $(Lu, Ce)_3(Al, Ga)_5O_{12}$ that emits green light, having a Ga proportion of 25% and a Ce proportion of 2.5%. With respect to the entire molded body 51, the first phosphor material is present with a weight proportion of 12.9%.

The second phosphor material is composed of $(Ca, Sr, Ba)_2Si_5N_8$:Eu with 10% Ca, 40% Sr and 50% Ba, with a proportion of 3.25% of Ca, Sr, Ba lattice sites being replaced with Eu. A weight proportion of the second phosphor material relative to the entire molded body 51, is at 2.8%. Both phosphor materials are preferably present as particles having diameters in the region of 15 μm.

Just as well, $Y_3Al_5O_{12}$:Nd with an Nd proportion of 8% is present as the filter material 4 for improving the color rendering index of the light emitted by the semiconductor component 1. A weight proportion of the filter material 4 relative to the entire molded body 51 is 10%.

Figure 4:
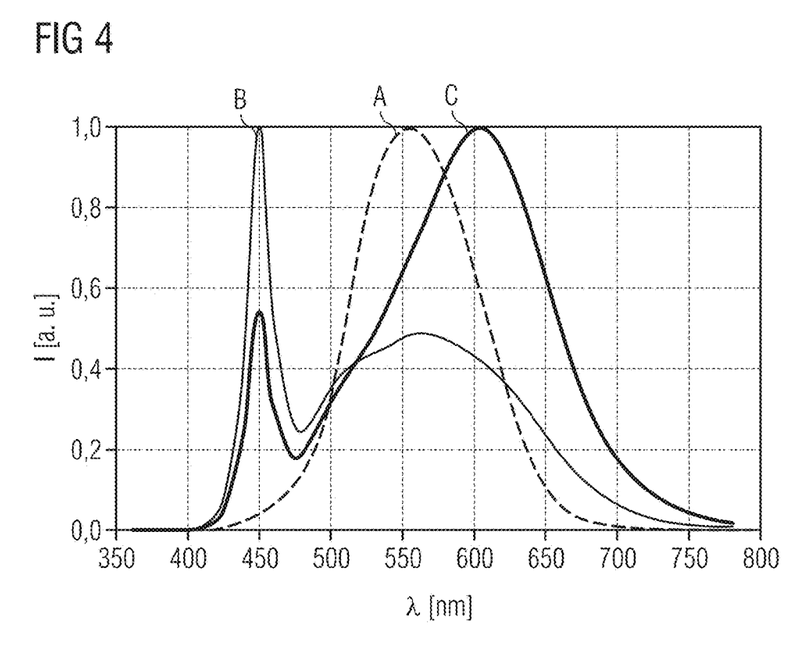

In particular semiconductor components emitting white light, see the typical spectrum of FIG. 4, curve C, show a comparatively small spectral overlap with the eye sensitivity curve, see curve A in FIG. 4. In contrast, in a cold-white emission, see curve B in FIG. 4, a relatively large spectral overlap with the eye sensitivity curve A is present. In FIGS. 4 and 5, in each case a wavelength λ in nm is plotted against an intensity I in arbitrary units, a.u. for short.

In order to particularly achieve an improved adjustment of the emission spectrum for warm white light to the eye sensitivity curve, the filter substance 4 is added. The effect of filter substance 4 can be seen in conjunction with FIG. 5A. Curve D corresponds to a semiconductor component without the filter material 4, curve E corresponds to the semiconductor component 1, as described in conjunction with FIG. 1.

Figure 5A:
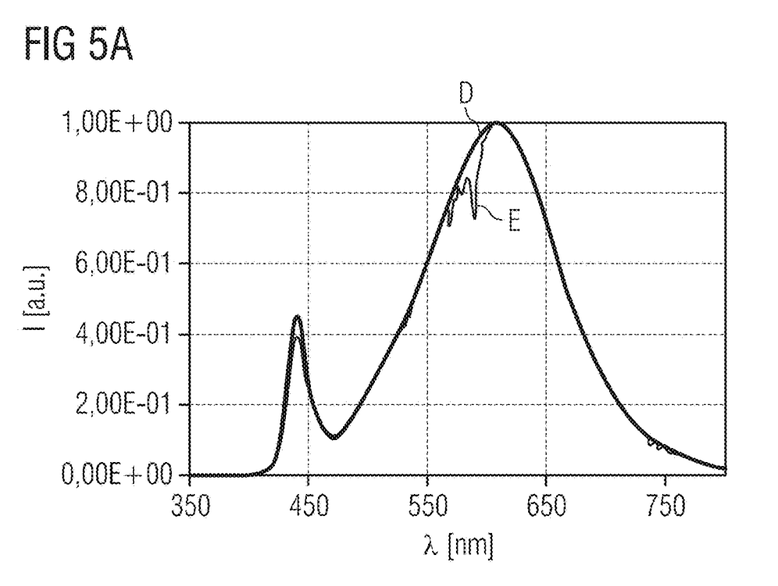

By means of the filter substance 4, a color rendering index is increased from 80 to 82 according to FIG. 5A from curve D toward curve E. The $R_a8$ value serves as a color rendering index here. By means of the filter substance, the CIE x coordinate is slightly increased from 0.460 to 0.461, the CIE y-coordinate remains unchanged at 0.410. The correlated color temperature is slightly increased from 2687 K to 2692 K by the filter substance 4. In other words, an effect by the filter substance 4 is essentially only exhibited regarding the color rendering index and not significant in terms of other photometric characteristic values such as the CIE color location or the correlated color temperature.

Figure 5B:
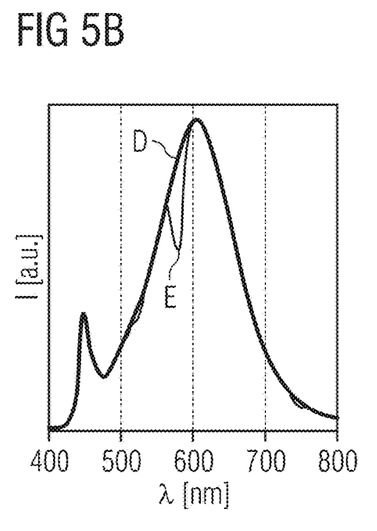
Figure 5C:
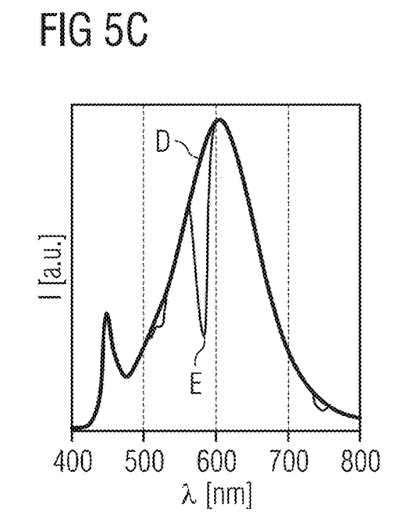

FIGS. 5B and 5C show the spectra with a color rendering index of 83 and a correlated color temperature of 2700 K, see in each case curves D. In curves E, in each case a filter substance is used, in analogy to the exemplary embodiment according to FIG. 1, however in different concentrations. Absorption of the secondary radiation by means of the filter substance 4 increases here from FIG. 5A to FIG. 5C.

As a result, a color rendering index of 88 can be achieved according to FIG. 5B and a CRI of 95 may be achieved according to FIG. 5C. Here, the filter substance 4 does not absorb or only insignificantly absorbs in the range of primary radiation which is generated directly by the semiconductor chip 2. Furthermore, filter substance 4 does not emit radiation in the visible spectral range but merely at wavelengths greater than 700 nm in the non-visible near-infrared spectral range.

Together with housing 6, the molded body 51 encloses the semiconductor chip 2 entirely. It is possible that the molded body 51 is formed as a collective lens or, in contrast to what is shown, as a diffuser lens. Just as well, the molded body 51 may protrude from a recess in the housing 6.

Figure 2:
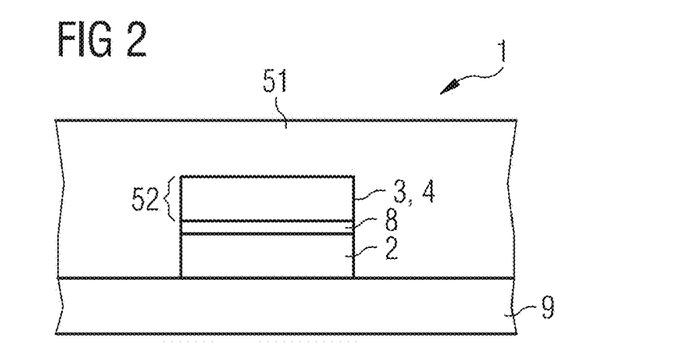

FIG. 2 shows another exemplary embodiment of the semiconductor component 1. A plate 52 is applied to the semiconductor chip 2 in close connection via an adhesive 8, the plate 52 containing the phosphor 3 and the filter substance 4 in a preferably homogeneously mixed fashion. A thickness of the adhesive 8 preferably is at least 0.5 µm and/or 5 µm at most. The plate 52 may be a ceramic plate, a glass plate or a silicone plate which contains the phosphor 3 as well as the filter substance 4 in corresponding concentrations. The plate 52 may have a constant thickness and be formed plan-parallel or be optionally provided with a roughening for improvement of light decoupling.

Optionally, the molded body 51 is present around the semiconductor chip 2 as well as around the plate 52. It is possible for the molded body 51 to contain additional light-scattering particles for a better mixture of the radiation or for adjusting a physical radiation characteristic. Such additional radiation scattering particles may also be present in any other exemplary embodiment and/or may be additionally contained in the molded body 51 according to FIG. 1 or in the plate 52 according to FIG. 2.

Figure 3:
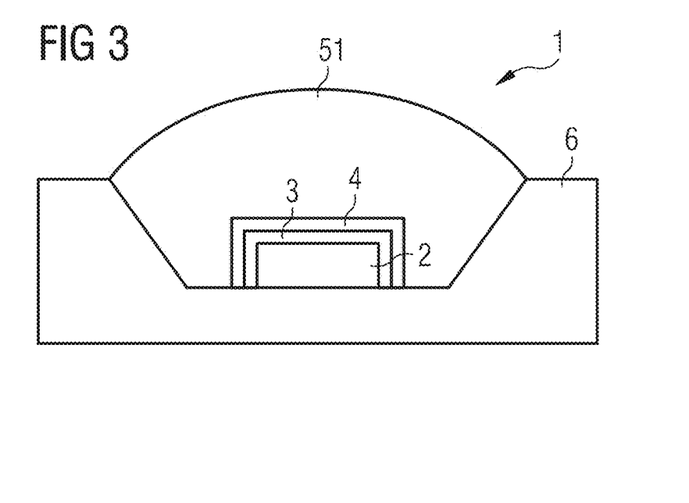

In the exemplary embodiment according to FIG. 3, the semiconductor chip 2 is surrounded by a first layer with the phosphor 3 and by a second layer with the filter material 4. The phosphor 3 and the filter material 4 are thus separated from one another. A corresponding separation of the phosphor 3 from the filter substance 4 may also be present in construction types as illustrated in conjunction with FIGS. 1 and 2.

Optionally, the arrangement including the semiconductor chip 2, the phosphor 3 as well as the filter substance 4 is followed, for example, by the lens-shaped molded body 51. The molded body 51 may be a clear encapsulation, as possible also in conjunction with FIG. 2.

FIG. 6 shows the absorption properties of $(Y_{1-x}, Nd_x)_3Al_5O_{12}$, which may serve as a filter substance 4. In FIGS. 6A and 6B, the diffuse reflection capacity R of the filter substance in % is plotted against the wavelength λ in nm for the x-values of 0.01, 0.04, 0.08, 0.12 and 0.16 as well as for 0.15, 0.25, 0.40, 0.55, 0.70, 0.80, 0.90 and 1. $(Y_{1-x}, Nd_x)_3Al_5O_{12}$ with one of the above x values may be considered in all exemplary embodiments as a filter substance 4.

Figure 6A:
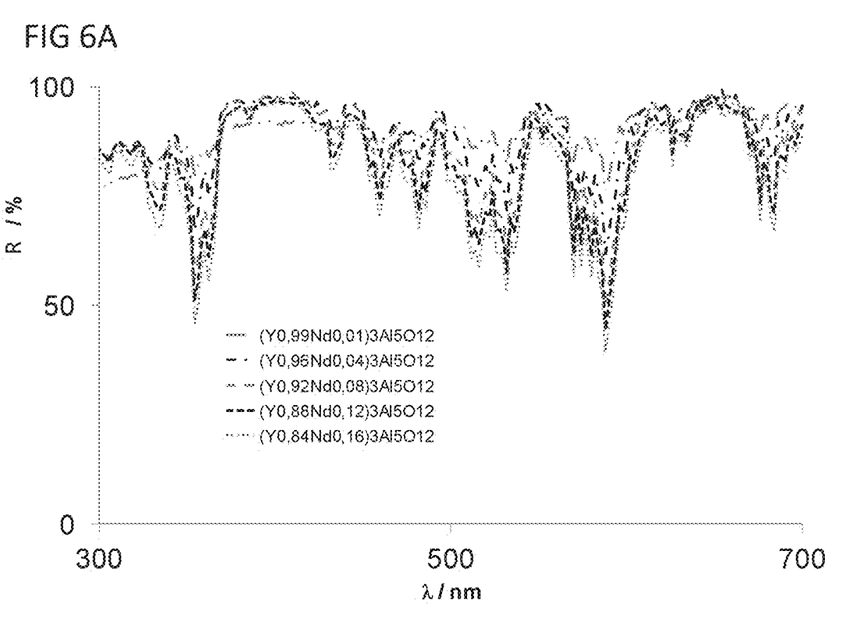
Figure 6B:
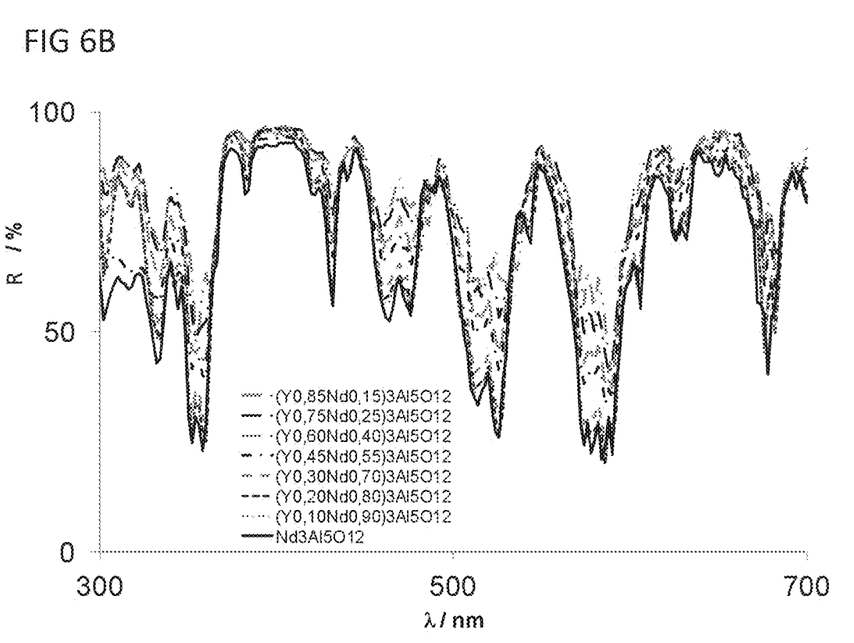

The diffuse reflection capacity R decreases and thus absorption increases along with an increasing X, i.e. an increasing Nd proportion. Here, in the Figures, $(Y_{1-x}, Nd_x)_3Al_5O_{12}$ was denoted with $(Y_1-xNdx)_3Al_5O_{12}$ for the sakes of clarity. Sharp absorption bands of said filter substance are particularly exhibited in the orange spectral range.

Figure 6C:
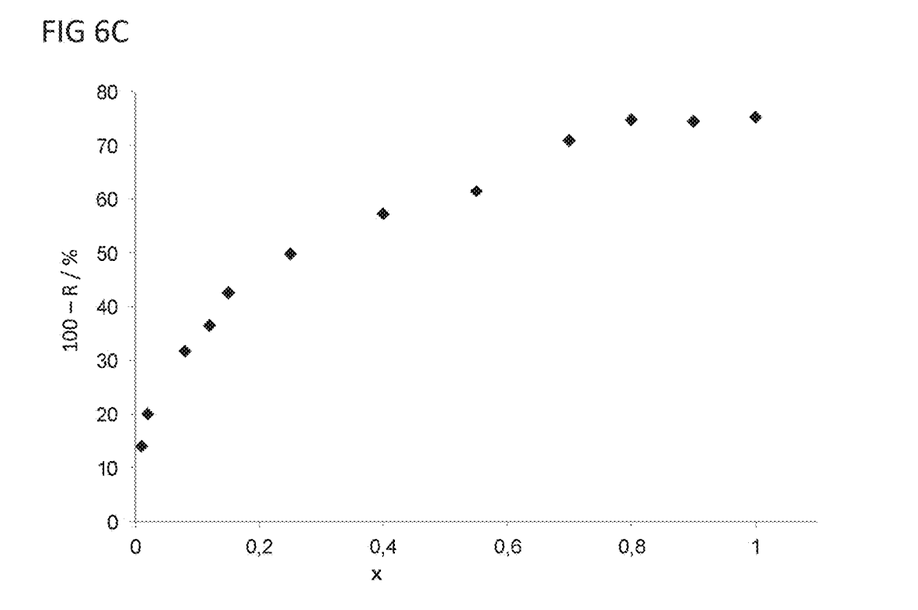
Figure 6D:
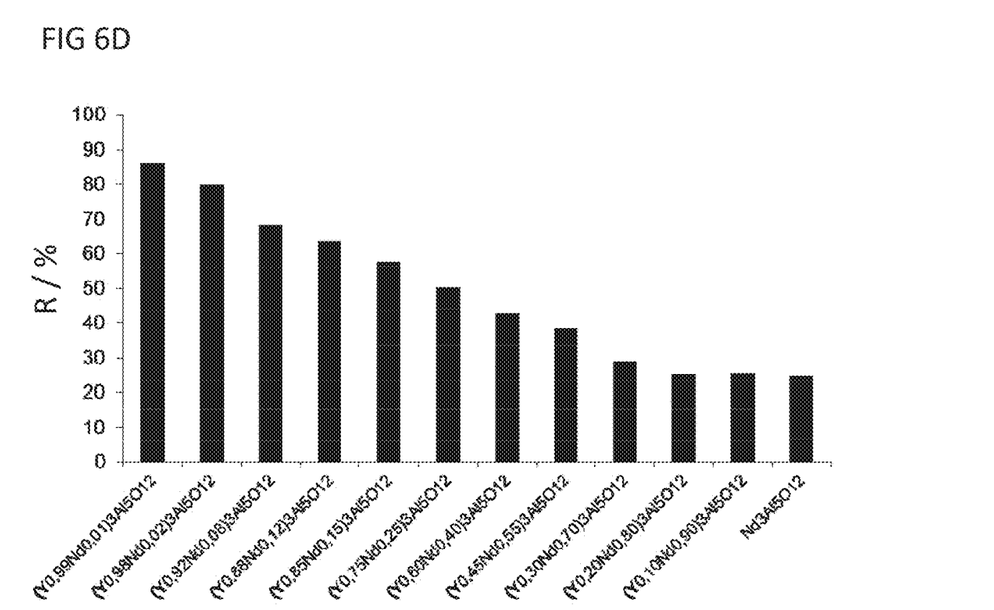

In FIG. 6C, the difference of 100 and the diffuse reflection capacity R in % is plotted against the Nd proportion x as a measure for absorption. Here, the diffuse reflection capacity R is averaged over the spectral range from 582 nm to 586 nm. Absorption in the orange spectral range increases continuously along with an increasing x. A respective illustration of the diffuse reflection capacity R in % compared to the Nd proportion x is shown as a bar chart in FIG. 6D.

The invention described herein is not limited by the description in conjunction with the exemplary embodiments. The invention rather comprises any new feature and any combination of features, particularly including any combination of features in the claims, even if said feature or said combination of features per se is not explicitly indicated in the patent claims or exemplary embodiments.

The invention claimed is:

1. An optoelectronic semiconductor component comprising:
    at least one optoelectronic semiconductor chip for generating primary radiation in a near-ultraviolet or in a visible spectral range;
    at least one phosphor for partial or complete conversion of the primary radiation into a longer-waved secondary radiation that is in the visible spectral range; and
    at least one filter substance for partial absorption of the longer-waved secondary radiation,
    wherein the phosphor and the filter substance are closely connected to the at least one optoelectronic semiconductor chip,
    wherein the filter substance is permeable to the primary radiation and does not or not significantly absorb the primary radiation,
    wherein the filter substance spectrally absorbs in a narrow-band type manner in a wavelength range greater than at least 530 nm with a spectral full width at half maximum of at most 20 nm,
    wherein the phosphor and the filter substance are randomly mixed through with one another so that no phase separation between the phosphor and the filter substance is present and the phosphor and the filter substance each are present in a homogenously distributed manner, and
    wherein a color rendering index and a feeling of contrast index of a mixed radiation, comprising the primary radiation and the longer-waved secondary radiation emitted by the optoelectronic semiconductor component, are increased by the filter substance.

2. The optoelectronic semiconductor component according to claim 1, wherein the filter substance absorbs spectrally in a narrow-band type manner in the wavelength range greater than at least 530 nm and at most 550 nm with a spectral full width at half maximum of at most 10 nm, and wherein the filter substance absorbs at least 2% and at most 20% of the entire longer-waved secondary radiation.

3. The optoelectronic semiconductor component according to claim 1, wherein the phosphor and the filter substance are present as particles and the particles of the phosphor and the filter substance are mixed-through, and wherein the filter substance is adapted to generate a tertiary radiation from the longer-waved secondary radiation, the tertiary radiation being in a near-infrared spectral range.

4. The optoelectronic semiconductor component according to claim 3, wherein the particles of the phosphor and of the filter substance are each embedded in a matrix material, and wherein the matrix material is a silicone or a silicone epoxy hybrid material.

5. The optoelectronic semiconductor component according to claim 3, wherein the particles of the phosphor and of the filter substance are present in a molded body which is formed directly around the at least one optoelectronic semiconductor chip.

6. The optoelectronic semiconductor component according to claim 3, wherein at least the particles of the filter substance are scattering particles having a medium diameter between including 0.5 μm and 30 μm.

7. The optoelectronic semiconductor component according to claim 3, wherein the particles of the filter substance are formed by semiconducting quantum dots and/or by at least one organic filter material.

8. The optoelectronic semiconductor component according to claim 3, wherein the particles of the phosphor and of the filter substance are present in a plate which is bonded to the at least one optoelectronic semiconductor chip.

9. The optoelectronic semiconductor component according to claim 1, wherein the optoelectronic semiconductor component is adapted to generate warm-white light having a correlated color temperature between including 2200 K and 5500 K, and wherein a color location of an overall radiation generated by the optoelectronic semiconductor component has a distance of at most 0.03 units to a blackbody curve in a CIE standard color table.

10. The optoelectronic semiconductor component according to claim 1, wherein the filter substance is inorganic and comprises one of the following elements: Er, Ho, Nd, Pm, Pr, or Sm.

11. The optoelectronic semiconductor component according to claim 10, wherein the filter substance has a structure of an aluminate, a glass, a garnet or belongs to one of these substance classes.

12. The optoelectronic semiconductor component according to claim 1, wherein the filter substance absorbs between including 0.5% and 10% of the longer-waved secondary radiation.

13. The optoelectronic semiconductor component according to claim 1, wherein the phosphor is a mixture of $(Lu,Ce)_3(Al,Ga)_5O_{12}$ and $(Ca,Sr,Ba)_2Si_5N_8$:Eu, wherein the filter substance comprises $Y_3Al_5O_{12}$:Nd, and wherein a quotient of a weight of the phosphor and a weight of the filter substance is between including 1.5 and 1.

14. The optoelectronic semiconductor component according to claim 1,
wherein the phosphor and the filter substance are embedded in a common matrix material,
wherein the filter substance comprises $(Y_{1-x}Nd_x)_3Al_5O_{12}$ with $0.06 \leq x \leq 0.3$,
wherein a weight proportion of Nd in a mixture of the phosphor, the filter substance and the matrix material is between including 1.5% and 6.5% and a weight proportion of $(Y_{1-x}Nd_x)_3Al_5O_{12}$ is between including 20% and 80%, and
wherein the matrix material is in direct contact with the at least one optoelectronic semiconductor chip and covers the at least one optoelectronic semiconductor chip entirely in a plan view.

15. The optoelectronic semiconductor component according to claim 1, wherein an absolute intensity maximum of the longer-waved secondary radiation emitted by the optoelectronic semiconductor component is between including 590 nm and 630 nm, and wherein an absolute intensity maximum of the primary radiation is between including 420 nm and 470 nm.

* * * * *